United States Patent
Yang et al.

(10) Patent No.: US 10,319,629 B1
(45) Date of Patent: Jun. 11, 2019

(54) SKIP VIA FOR METAL INTERCONNECTS

(71) Applicant: International Business Machines Corporation, Armonk, NY (US)

(72) Inventors: Chih-Chao Yang, Glenmont, NY (US); Lawrence A. Clevenger, Saratoga Springs, NY (US); Brent A. Anderson, Jericho, VT (US); Nicholas A. Lanzillo, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/973,630

(22) Filed: May 8, 2018

(51) Int. Cl.
*H01L 21/768* (2006.01)
*H01L 23/522* (2006.01)
*H01L 23/532* (2006.01)
*H01L 21/311* (2006.01)

(52) U.S. Cl.
CPC .. *H01L 21/76831* (2013.01); *H01L 21/31116* (2013.01); *H01L 21/76807* (2013.01); *H01L 21/76843* (2013.01); *H01L 23/5226* (2013.01); *H01L 23/5329* (2013.01)

(58) Field of Classification Search
CPC combination set(s) only.
See application file for complete search history.

(56) References Cited

U.S. PATENT DOCUMENTS

| | | | |
|---|---|---|---|
| 7,071,097 B2 | 7/2006 | Colburn | |
| 7,620,926 B1 | 11/2009 | Tuan | |
| 7,825,024 B2 | 11/2010 | Lin et al. | |
| 8,093,099 B2 | 1/2012 | Purushothaman et al. | |
| 8,906,801 B2 | 12/2014 | Richter et al. | |
| 9,064,717 B2 | 6/2015 | Purushothaman et al. | |
| 9,330,974 B2 | 5/2016 | Kim et al. | |
| 9,786,557 B1 | 10/2017 | Chi et al. | |
| 9,805,972 B1 * | 10/2017 | Zhang | H01L 21/76816 |
| 2005/0041405 A1 | 2/2005 | Kawagoe | |
| 2011/0095435 A1 | 4/2011 | Volant et al. | |
| 2015/0014778 A1 * | 1/2015 | Cheng | H01L 23/5226 257/369 |

\* cited by examiner

*Primary Examiner* — Ratisha Mehta
(74) *Attorney, Agent, or Firm* — Cantor Colburn LLP; Vazken Alexanian (57) ABSTRACT

Semiconductor devices including skip via structures and methods of forming the skip via structure include interconnection between two interconnect levels that are separated by at least one other interconnect level, i.e., skip via to connect Mx and Mx+2 interconnect levels, wherein a portion of the intervening metallization level (MX+1) is in a pathway of the skip via.

20 Claims, 4 Drawing Sheets

SKIP VIA FOR METAL INTERCONNECTS

BACKGROUND

This invention relates generally to interconnect structures for integrated circuits, and more specifically to fabrication methods and resulting structures for skip vias formed between non-adjacent multilevel metallization layers in a semiconductor device.

In fabricating semiconductor devices, multiple electrical connections are typically formed to each device, and millions of devices can be on a substrate. Openings filled with a conductive material are typically formed to connect the device connections to higher device levels for eventual connection to the electrical package contacts. With shrinking device sizes, the pitches between these electrical vias have also been shrinking.

Vias can typically be formed through dielectric layers, for example, interlayer dielectrics, to metallized layers and to components of the actual devices. The electrical connections between devices on the substrate and from the package contacts to the devices can be routed through the different metallized layers, which can act as wiring (e.g., channels). The multiple levels of interconnecting wiring are typically separated by the intervening dielectric layers through which the vias are formed. In typical integrated circuit packages, seven or more metallization levels could be involved. The layout of the electrical connections can therefore be incredibly complex. Multiple patterning techniques involving registered mask patterns can be used to form the different levels. Multiple cycles of masking and etching can be used. This is typically considered the back-end-of-line (BEOL) fabrication stage.

With ever decreasing device dimensions, forming the individual components and electrical contacts becomes more difficult. An approach is therefore needed that retains the positive aspects of traditional field effect transistor (FET) structures, while overcoming the scaling issues created by forming smaller device components and the interconnects.

SUMMARY OF THE INVENTION

Embodiments of the present invention are generally directed to semiconductor devices and methods for forming skip via structures in a semiconductor device. A non-limiting example method of forming the skip-via structure in the semiconductor device includes forming a first interconnect level (Mx) including depositing a first dielectric layer on a substrate including one or more semiconductor devices, forming at least one first metal conductor in the first dielectric layer, wherein the at least one metal conductor and the first dielectric have coplanar surfaces, and depositing a first cap layer on the coplanar surfaces. A second interconnect level (Mx+1) is formed by depositing a second dielectric layer on the first cap layer. At least one second metal conductor is formed in the second dielectric layer, wherein the second metal conductor includes a second cap layer on a top surface thereof and a liner layer that collectively encapsulate the second metal conductor. A third interconnect level (Mx+2) is formed on the second interconnect level and includes depositing a second dielectric layer on the second interconnect level. A via opening is formed in the second and third dielectric layers to the first metal conductor, wherein the via opening exposes a portion of the second cap layer, a sidewall of the second metal conductor, and a portion of the first cap layer. The first cap layer is removed at a bottom of the via opening to expose a surface of the first metal conductor and a spacer layer is deposited on sidewalls of the via opening including the sidewall of the second metal conductor. The via opening is filled with a metal conductor, wherein the second metal conductor in the second interconnect level is electrically isolated from the filled via opening extending from the third interconnect level to the first metal conductor of the first interconnect level, and wherein the first and second cap layers have different etch selectivities.

A non-limiting example of the semiconductor device in accordance with one or more aspects of the present invention includes a first interconnect level (Mx) including a first dielectric layer, a first metal conductor, and a first capping layer overlaying the first metal conductor. A second interconnect level (Mx+1) is on the first interconnect layer and includes a second dielectric layer, a second metal conductor, and a second capping layer overlaying the second metal conductor, wherein the second capping layer has a different etch selectivity relative to the first capping layer. A third interconnect level (Mx+2) is on the second interconnect level and includes a third dielectric layer, and a third metal conductor. A skip via opening filled with a metal extends from the third interconnect level to the first interconnect level, wherein a portion of the second metal conductor including a sidewall thereof in the second interconnect level is in a path of the skip via opening and is electrically isolated from the filled metal via opening.

A non-limiting example of the semiconductor device in accordance with one or more other aspects of the present invention includes a first interconnect level (Mx) including a first dielectric layer, a first metal conductor, and a first capping layer overlaying the first metal conductor and a first liner layer encapsulating the first metal conductor. A second interconnect level (Mx+1) is on the first interconnect layer including a second dielectric layer, a second metal conductor, and a second capping layer overlaying the second metal conductor and a second liner layer encapsulating the second metal conductor, wherein the second capping layer has a different etch selectivity relative to the first capping layer. A third interconnect level (Mx+2) is on the second interconnect level including a third dielectric layer, and a third metal conductor. A skip via including a metal extends from the third interconnect level to the first interconnect level, wherein a portion of the second metal conductor including the second capping layer and a sidewall thereof in the second interconnect level is in a path of the skip via during formation thereof, wherein the sidewall includes a self-formed barrier layer effective in combination with the capping layer to be electrically isolated from the skip via.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure ("FIG.") 1 is a schematic cross-sectional view depicting a semiconductor device including two underlying metallization levels provided in interlevel dielectric layers in accordance with one or more embodiments of the present invention.

It will be appreciated that for simplicity and clarity of illustration, elements shown in the drawings have not necessarily been drawn to scale. For example, the dimensions of some of the elements could be exaggerated relative to other elements for purpose of clarity.

DETAILED DESCRIPTION

The present invention is generally directed to fabrication methods and resulting structures for skip vias formed between non-adjacent multilevel metallized layers in a semiconductor. The skip vias provide interconnection between two metallization levels that are separated by at least one other metallization level, i.e., skip via to connect Mx and Mx+2 interconnects, wherein a portion of the other metallization level (MX+1) is in a pathway of the skip via. For example, the skip-via can connect a first metallization layer, M1, to a third metallization layer, M3. As will be described in greater detail herein, the intervening metal interconnect is electrically isolated from the skip via.

Detailed embodiments of the integrated circuit including the skip via structure and methods for fabricating an integrated circuit including the skip via structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, ULSI, etc.) application specific integrated circuits (ASICS) and processors.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

Figure 1:
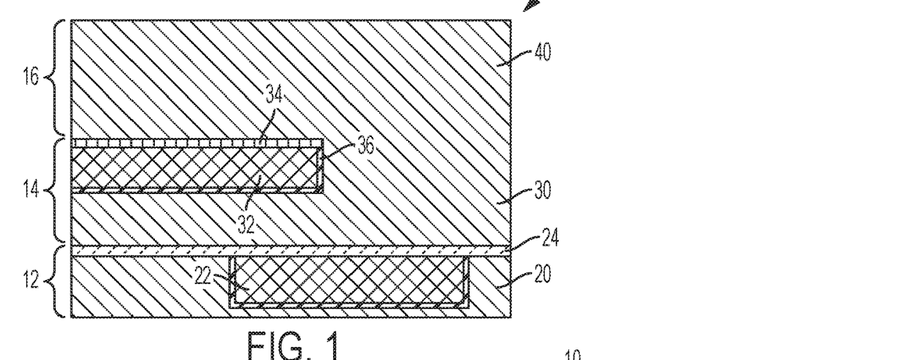

Referring now to the drawings in which like numerals represent the same or similar elements and initially to FIG. 1, a semiconductor device 10 including a multilevel metallization scheme with intervening metallization and interlayer dielectric layers is generally shown, in accordance with one or more embodiments of the present invention.

The semiconductor device 10 includes a first interconnect level 12 (i.e., first metallization layer), second interconnect level 14 (i.e., second metallization layer), and a third interconnect level 16 (i.e., third metallization layer) provided on a substrate (not shown). As will be described in greater detail herein, the skip via structures in accordance with one or more embodiments of the present invention provide interconnection between two interconnect levels that are separated by at least one other interconnect level, e.g., between the third metallization layer and the first interconnect level, wherein the second interconnect level can be referred to as the intervening interconnect level and is electrically isolated from the skip via structure. Although reference is made to the first, second and third interconnect levels, it should be apparent that the terms first, second and third are relative and the skip via structures described herein are not intended to be limited to these particular interconnect levels as typical integrated circuit packages can include seven or more metallization levels.

The first interconnect level 12 includes a metal conductor 22 (i.e., a conductive interconnect line) lithographically formed within a layer of dielectric material 20 disposed on a substrate (not shown). The metal conductor 22 can be copper, aluminum, a combination thereof, or the like. The metal conductor can further include a barrier layer 26 to prevent diffusion of the conductor into the dielectric material 20. A dielectric nitride capping layer 24 is provided on the first interconnect level. Suitable materials for forming the capping layer and/or the barrier layer include, without limitation, For example, the barrier layer can be formed of tantalum (Ta), tantalum nitride (TaN), cobalt (Co), ruthenium (Ru), titanium (Ti), titanium nitride (TiN), tungsten nitride (WN), or combinations thereof. The capping can be formed of silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), silicon oxycarbide (SiOC), hydrogenated silicon carbide, silicon dioxide, organosilicate glass, and other low-k dielectrics or combinations thereof. The capping layer 24 and or the barrier layer 26 can be deposited by PVD, CVD, or ALD processes. The first interconnect level 12 can further include overlay alignment markers (not shown) formed of a metal conductor, one of which is shown, which are high precision features that are used as the reference when positioning subsequent patterns to the first pattern.

The second interconnect level 14 is provided on the first interconnect level 12 and includes metal conductor 32 lithographically formed within an interlayer dielectric 30 on the dielectric nitride capping layer 24. The metal conductor 32 can further include a barrier layer 35 as previously described to prevent diffusion of the conductor into the dielectric material 30 and a capping layer 34 as previously described with the proviso that capping layer 34 is of a different material and has a different etch selectivity than capping layer 24.

The third interconnect level 16 is provided on the second interconnect level 14 and includes an interlayer dielectric 40.

The first, second and third dielectric materials 20, 30, 40 can be formed of the same of different dielectric material. The interlayer dielectric can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric can be deposited by PECVD procedures as is generally known in the art.

Figure 2:
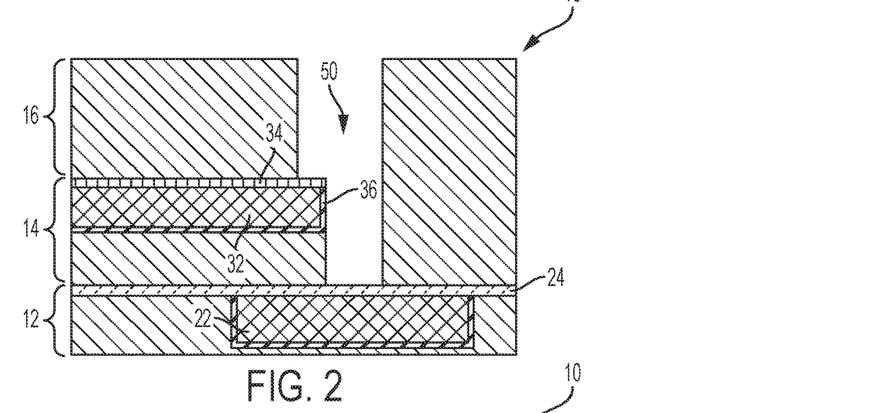
FIG. 2 is schematic cross-sectional view of a via opening formed in the semiconductor device of FIG. 1 to a barrier layer overlying a non-adjacent one of the underlying metallization levels in accordance with one or more embodiments of the present invention.

Referring now to FIG. 2, a via opening 50 is formed in the dielectric materials 20, 30 and 40 and can generally be self-aligned to the metal conductor 32 of the second interconnect level 14. The via opening 50 spans the third interconnect level to the barrier layer 24 of the first interconnect level 12 and exposes a portion of the capping layer 34 and the barrier layer 36 on the metal conductor 32 of the second interconnect level 14 as shown. The via opening 50 can be formed by a selective directional etch, for example, a reactive ion etch (RIE).

Figure 3:
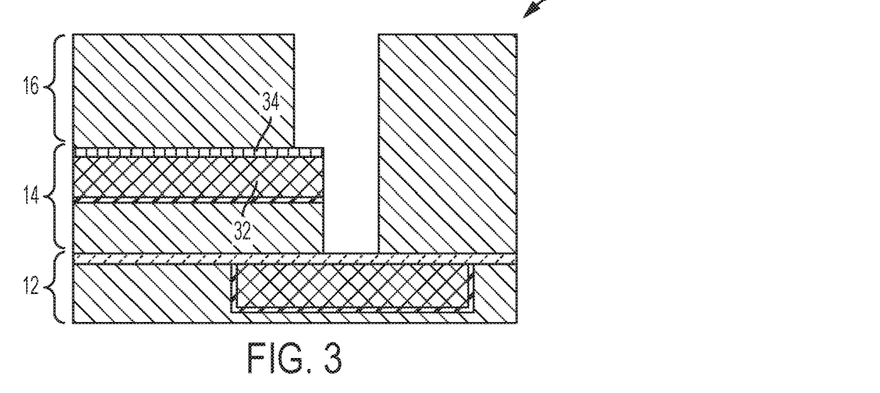
FIG. 3 is a schematic cross-sectional view of the semiconductor device of FIG. 2 subsequent to an optional sidewall liner removal of an intervening metallization layer in accordance with one or more embodiments of the present invention.

In FIG. 3, the exposed portion of the barrier layer 36 is removed (i.e., the barrier layer on the sidewall the metal conductor 32). The exposed portion can be removed by a dry or wet etch process selective to the barrier layer. Optionally, the exposed sidewall of the metal conductor can be recessed.

Figure 4:
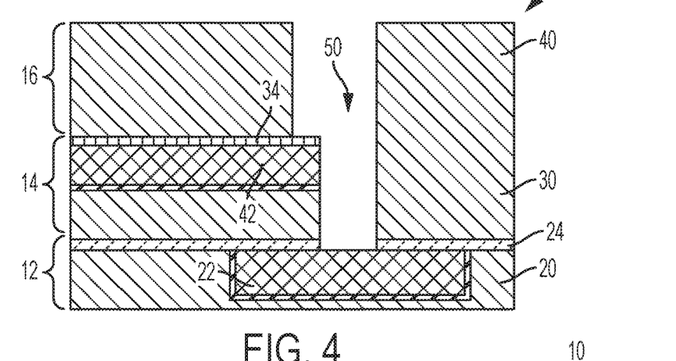
FIG. 4 is a schematic cross-sectional view of the semiconductor device of FIG. 3 subsequent to removal of the barrier layer at the bottom of the via opening in accordance with one or more embodiments of the present invention.

In FIG. 4, the exposed barrier layer 24 at the bottom of the via opening 50 is selectively removed relative to the top capping layer 34 in the second interconnect level 14. As noted above, the capping layer 24 is formed of a different material and has a different etch selectivity than capping layer 34. By way of example, capping layer 24 can be formed of NBLoK (SiCNH) and capping layer 34 can be formed of SiN(Al). The exposed NBLoK (SiCNH) at the bottom of via opening 50 can be removed by RIE.

Figure 5:
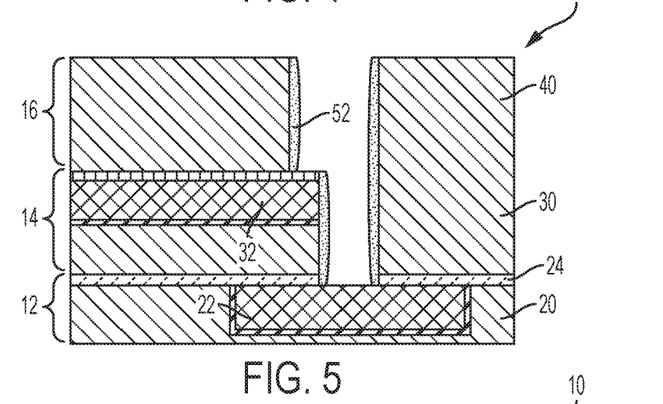
FIG. 5 is a schematic cross-sectional view of the semiconductor device of FIG. 4 subsequent to sidewall spacer formation in the via opening in accordance with one or more embodiments of the present invention.

In FIG. 5, a conformal layer 52 of spacer material is then deposited onto the semiconductor device 10 and subjected to a selective directional etch process such as RIE so as to remove the spacer material from that horizontal surfaces, thereby providing the spacer material on the sidewalls of the surfaces defining the via opening. The spacer material can be a low k material such as, but not limited to, $Si_3N_4$, SiC, SiC(N, H) or the like, which can be deposited by chemical vapor deposition, for example.

Figure 6:
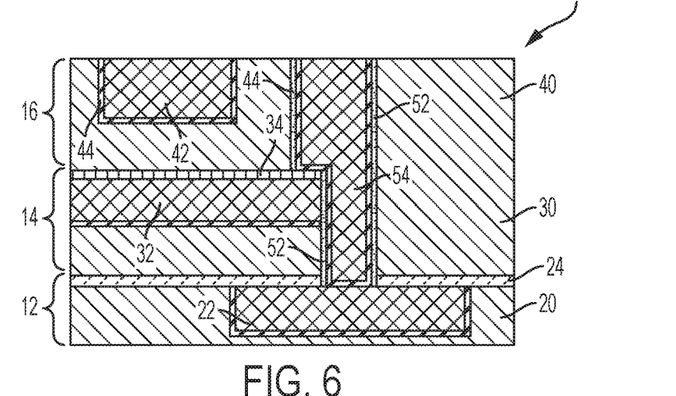
FIG. 6 is a schematic cross sectional view of the semiconductor device of FIG. 5 subsequent to a via opening metallization process to form the skip via structure in accordance with one or more embodiments of the present invention.

In FIG. 6, the interlayer dielectric 40 is lithographically patterned and etched to form one or more openings, one of which is shown. The lithographic process for forming the one or more openings in the interlayer dielectric 40 generally includes deposition of a photoresist onto the surface. The photoresist is sensitive to radiation, e.g., extreme ultraviolet (EUV) radiation, and, depending on the photoresist used, portions of the photoresist that are exposed to the radiation can be removed (or left remaining) by a development process. The one or more openings are then formed in the interlayer dielectric by etching or otherwise modifying the interlayer dielectric in the areas from which the photoresist has been removed. For example, a reactive ion etch process can be used to anisotropically remove portions of the interlayer dielectric layer 40 to form the one or more openings. The particular pattern is not intended to be limited and can include a trench feature, a via feature, combinations thereof, or the like.

A liner layer 44 (i.e., diffusion barrier layer) is conformally deposited onto the patterned interlayer dielectric 40. For example, tantalum, tantalum nitride, cobalt, ruthenium, titanium, titanium nitride, tungsten nitride, and combinations of more than one material (for example tantalum nitride/tantalum or tantalum nitride/cobalt). As previously described, the presence of the liner layer such as titanium nitride, for example, insures that a metal such copper, which can participate in interdiffusion during subsequent annealing processes, will not further diffuse into interlayer dielectric. The liner layer 44 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is subjected to a planarization process to remove any metal overburden (includes seed layer and liner layer removal) such that a top surface of the metal is substantially coplanar to the low k dielectric layer as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

In this manner, a metal conductor 42 is formed in the opening and the via 50 is filled as well so as to provide electrical connection from the third interconnect level 16 to the first interconnect level 12 while electrically isolating the second interconnect level 14. Electrical isolation from the metal conductor 32 in the second interconnect level 14 by the presence of the top capping layer 34 and the spacer layer 52 on the sidewalls of the metal conductor. The presence of the barrier layer 44, i.e., liner layer, in the via opening 50 permits relatively thin thicknesses for the top capping layer 34 and the spacer layer 52.

Figure 7:
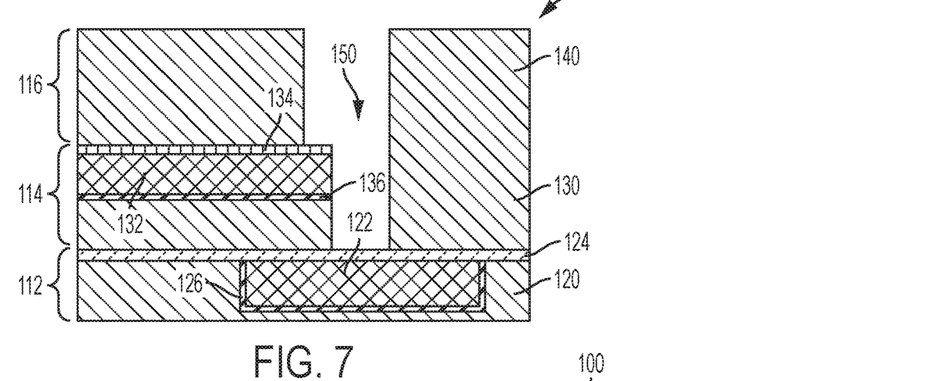
FIG. 7 is a schematic cross-sectional view depicting a semiconductor device including a via opening to a barrier layer overlying a non-adjacent one of the underlying metallization levels in accordance with one or more embodiments of the present invention.

Referring now to FIGS. 7-10, there is schematically illustrated a process flow for forming a semiconductor device including a skip via structure in accordance with one or more other embodiments. As shown in FIG. 7, the semiconductor device 100 includes a first interconnect level 112 (i.e., first metallization layer), second interconnect level 114 (i.e., second metallization layer), and a third interconnect level 116 (i.e., third metallization layer) provided on a substrate (not shown). A via opening 150 is formed and spans from the third interconnect level 116 to the first interconnect level 112.

The first interconnect level 112 includes a metal conductor 122 lithographically formed within an interlayer dielectric 120 disposed on a substrate (not shown). The metal conductor 122 can be copper, aluminum, a combination thereof, or the like. The metal conductor can further include a barrier layer 126 to prevent diffusion of the conductor into the dielectric material 120. A dielectric nitride capping layer 124 is provided on the first interconnect level.

The second interconnect level 114 is provided on the first interconnect level 112 and includes metal conductor 132 lithographically formed within an interlayer dielectric 130 on the dielectric nitride capping layer 124. The metal conductor 132 can further include a barrier layer 136 as previously described to prevent diffusion of the conductor into the dielectric material 130 and a capping layer 134 as previously described with the proviso that capping layer 134 is of a different material and has a different etch selectivity than capping layer 124.

The third interconnect level 116 is provided on the second interconnect level 114 and includes an interlayer dielectric 140. The first, second and third dielectric materials 20, 30, 40 can be formed of the same of different dielectric material as described above.

The via opening 150 exposes a portion of the capping layer 134 and the sidewall of the metal conductor 132 of the second interconnect level 114 and the barrier layer 124 at the bottom of the via opening 150.

Figure 8:
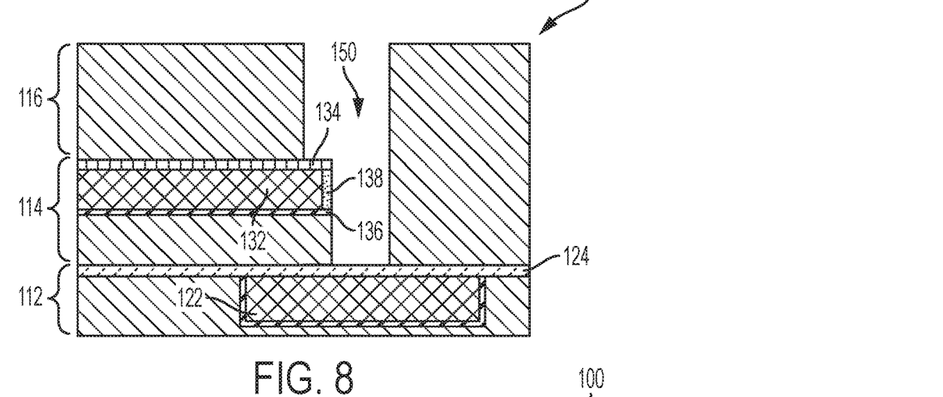
FIG. 8 is a schematic cross sectional view of the semiconductor device of FIG. 7 subsequent to sidewall insulator formation of an intervening metallization layer in accordance with one or more embodiments of the present invention.

In FIG. 8, an insulator 138 is formed or selectively deposited onto the exposed sidewall of the metal conductor 132. For example, the alloy can be selected to include an alloying element that is selected to be reactive with the insulator material during an annealing/curing step to form an oxide on the exposed sidewall surface. By way of example, the metal conductor can be a copper manganese alloy and the insulator material can include selective deposition of a silicon dioxide material. Upon annealing/curing, the copper manganese alloy will react with oxygen and silicon in a silicon dioxide interlayer dielectric to self-form manganese silicon oxide ($MnSi_xO_y$, wherein x:y=1:3 to 3:5), which is an effective barrier layer so as to prevent copper diffusion. Suitable copper alloys include, without limitation, CuMn, CuAl, CuTi, CuSn, CuGe, CuMg, CuNi, and the like.

In one or more embodiments, the amount of alloying element in the copper alloy is generally from about 0.1 to about 60 atomic percentage. In one or more other embodiments, the amount of alloying element in the copper alloy is generally from about 0.5 to about 40 atomic percentage; and in still one or more other embodiments, the amount of alloying element in the copper alloy is generally from about 1 to about 30 atomic percentage. In one or more embodiments, the copper alloy thickness is between 200 Å and 10,000 Å. The copper alloy layer can be deposited by plasma vapor deposition (PVD), chemical vapor deposition (CVD), sputtering, atomic layer deposition (ALD), or the like.

The insulator 138 can be chosen from any suitable insulating material including, but not limited to oxide-nitride-oxide, $SiO_2$, $TaO_5$, $PSiN_x$ $Si_3N_4$, SiON, SiC, $TaO_2$, $ZrO_2$, $HfO_2$, $Al_2O_3$, mixtures thereof or the like.

Figure 9:
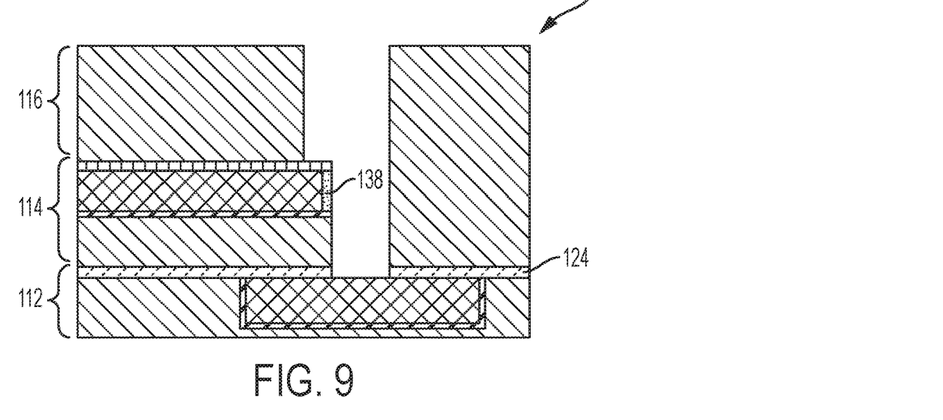
FIG. 9 is a schematic cross sectional view of the bottom electrode structure of FIG. 8 subsequent to removal of the barrier layer at the bottom of the via opening in accordance with one or more embodiments of the present invention.

In FIG. 9, the exposed barrier layer 124 at the bottom of the via opening 150 is selectively removed relative to the exposed portion of top capping layer 134 in the second interconnect level 14. As noted above, the capping layer 124 is formed of a different material and has a different etch selectivity than capping layer 134 and can be selectively removed by RIE.

Figure 10:
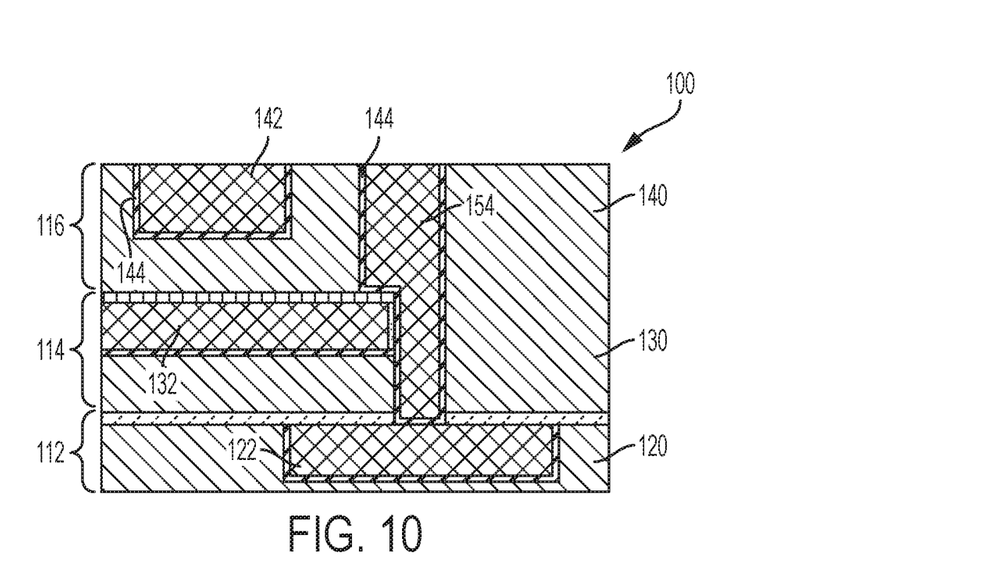
FIG. 10 is a schematic cross sectional view of the semiconductor device of FIG. 9 subsequent to a via opening metallization process to form the skip via structure in accordance with one or more embodiments of the present invention.

In FIG. 10, the interlayer dielectric 140 in the third interconnect level 116 is lithographically patterned and etched to form one or more openings, one of which is shown. A liner layer 144 (i.e., diffusion barrier layer) is conformally deposited onto the patterned interlayer dielectric 140. For example, tantalum, tantalum nitride, cobalt, ruthenium, titanium, titanium nitride, tungsten nitride, and combinations of more than one material (for example tantalum nitride/tantalum or tantalum nitride/cobalt). As previously described, the presence of the liner layer such as titanium nitride, for example, insures that a metal such copper, which can participate in interdiffusion during subsequent annealing processes, will not further diffuse into interlayer dielectric. The liner layer 144 can be deposited by PVD, CVD, or ALD processes.

Next, an optional conformal seed layer (not shown) is deposited. Following deposition of the seed layer, a layer of metal is then deposited. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %). The metal layer can be formed by CVD, sputtering, electrochemical deposition or like processes.

Following formation of the metal layer, the substrate is subjected to a planarization process to remove any metal overburden (includes seed layer and liner layer removal) such that a top surface of the metal is substantially coplanar to the low k dielectric layer as shown. In this manner, a metal conductor 142 and a filled metal via 154 are formed. The filled metal via, i.e., skip via, provides electrical connection from the third interconnect level 116 to the first interconnect level 112 while electrically isolating the second interconnect level 114.

Figure 11:
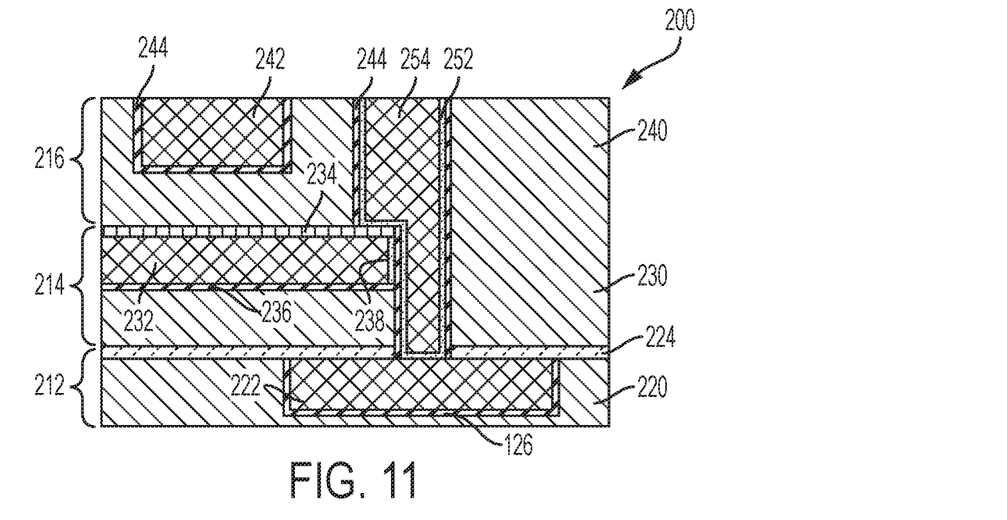
FIG. 11 is a schematic cross sectional view of a skip via structure in accordance with one or more embodiments of the invention.

FIG. 11 schematically illustrates a cross sectional view of a semiconductor device 200 including a skip via structure as generally described in FIGS. 7-10 and further including the spacer layer as generally described in FIG. 5 in accordance with one or more other embodiments of the invention. The semiconductor device 200 includes a first interconnect level 212, a second interconnect level 214 and a third interconnect level 216.

The first interconnect level 212 includes a metal conductor 222 lithographically formed within an interlayer dielectric 220 disposed on a substrate (not shown). The metal conductor 222 can further include a barrier layer 226 to prevent diffusion of the conductor into the dielectric material 220. A dielectric nitride capping layer 224 is provided on the first interconnect level.

The second interconnect level 214 is provided on the first interconnect level 212 and includes metal conductor 232 lithographically formed within an interlayer dielectric 230 on the dielectric nitride capping layer 224. The metal conductor 232 can further include a barrier layer 236 as previously described to prevent diffusion of the conductor into the dielectric material 240 and a capping layer 234 as previously described with the proviso that capping layer 234 is of a different material and has a different etch selectivity than capping layer 224.

The third interconnect level 216 is provided on the second interconnect level 214 and includes an interlayer dielectric 240, a metal conductor 242, and a filled metal via 254 extending from the third interconnect level 216 to the first interconnect level 212. The metal conductor 242 can further include a barrier layer 244 as previously described to prevent electromigration of the conductor into the dielectric material 240.

The via opening for forming the metal filled via 154 exposes a portion of the capping layer 234 and the sidewall of the metal conductor 232. An insulator 238 can be selectively deposited onto the exposed sidewall surface of the metal conductor 232 or self-formed as described above. A conformal spacer layer 252 can then be formed on the sidewalls of the via opening prior to deposition liner layer 244.

Advantageously, the skip via as described herein provides for an increased via area at the bottom because the metal conductor in the intervening interconnect level can be in the pathway of the via extending from an upper interconnect level to a lower interconnect level and be electrically isolated.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A method of forming a skip-via structure in a semiconductor device, the method comprising:
    forming a first interconnect level (Mx) comprising depositing a first dielectric layer on a substrate including one or more semiconductor devices, forming at least one first metal conductor in the first dielectric layer, wherein the at least one metal conductor and the first dielectric have coplanar surfaces, and depositing a first cap layer on the coplanar surfaces;
    forming a second interconnect level (Mx+1) comprising depositing a second dielectric layer on the first cap layer, forming at least one second metal conductor in the second dielectric layer, wherein the second metal conductor comprises a second cap layer on a top surface thereof and a liner layer that collectively encapsulate the second metal conductor;
    forming a third interconnect level (Mx+2) comprising depositing a third dielectric layer on the second interconnect level;
    forming a via opening in the second and third dielectric layers to the first metal conductor, wherein the via opening exposes a portion of the second cap layer, a sidewall of the second metal conductor, and a portion of the first cap layer;

removing the first cap layer at a bottom of the via opening to expose a surface of the first metal conductor;

depositing a spacer layer on sidewalls of the via opening including the sidewall of the second metal conductor; and filling the via opening with a metal conductor, wherein the second metal conductor in the second interconnect level is electrically isolated from the filled via opening extending from the third interconnect level to the first metal conductor of the first interconnect level, and wherein the first and second cap layers have different etch selectivities.

2. The method of claim 1, wherein forming the via opening comprises selectively etching the first cap layer at a bottom of the via opening without removing the second cap layer.

3. The method of claim 1, wherein filling the via opening with the metal conductor comprises depositing a barrier layer on the sidewalls defining the via opening prior to filling the via opening with the metal conductor.

4. The method of claim 1, wherein forming the via opening further comprises forming one or more openings in the third dielectric layer and filling the one or more openings with the metal when filling the via opening.

5. The method of claim 1, wherein the one or more openings comprise a trench, a via, or combinations thereof.

6. The method of claim 1, wherein the one or more openings define a third metal conductor in the third interconnect level.

7. The method of claim 1 further comprising self-forming an insulator on the sidewall of the second metal conductor, wherein self-forming the insulator comprises reacting an alloying element in the second metal conductor with at least the oxygen in the spacer layer to form an oxide of the alloying element on the sidewall of the second metal conductor.

8. A semiconductor device comprising:
a first interconnect level (Mx) comprising a first dielectric layer, a first metal conductor, and a first capping layer overlaying the first metal conductor;
a second interconnect level (Mx+1) on the first interconnect layer comprising a second dielectric layer, a second metal conductor, and a second capping layer overlaying the second metal conductor, wherein the second capping layer has a different etch selectivity relative to the first capping layer;
a third interconnect level (Mx+2) on the second interconnect level comprising a third dielectric layer, and a third metal conductor; and
a skip via opening filled with a metal extending from the third interconnect level to the first interconnect level, wherein a portion of the second metal conductor including a sidewall thereof in the second interconnect level is in a path of the skip via opening and is electrically isolated from the filled metal via opening.

9. The semiconductor device of claim 8, wherein the skip via opening further comprises a spacer insulator on vertical sidewalls defining the filled metal via opening.

10. The semiconductor device of claim 8, wherein the exposed sidewall of the second metal conductor in the second interconnect level further comprises a self-formed barrier layer thereon.

11. The semiconductor device of claim 10, wherein the self-formed barrier layer comprises a reaction product between an alloying element in the second metal conductor and at least oxygen in the spacer insulator.

12. The semiconductor device of claim 10, wherein the self-formed barrier layer comprises $MnSi_xO_y$, wherein x:y=1:3 to 3:5.

13. The semiconductor device of claim 8, wherein the first, second and third metal conductor and the metal filled via opening comprise Cu, Co, Al, AlCu, Ti, TiN, Ta, TaN, W, WN, MoN, Pt, Pd, Os, Ru, $IrO_2$, $ReO_2$, $ReO_3$, alloys thereof, or mixtures thereof.

14. The semiconductor device of claim 8, wherein the skip via opening further comprises a liner on sidewalls defining the skip via opening.

15. The semiconductor device of claim 8, wherein the skip via opening further comprise spacer material on sidewalls defining the skip via opening, and a liner layer on the spacer material.

16. A semiconductor device comprising:
a first interconnect level (Mx) comprising a first dielectric layer, a first metal conductor, and a first capping layer overlaying the first metal conductor and a first liner layer encapsulating the first metal conductor;
a second interconnect level (Mx+1) on the first interconnect layer comprising a second dielectric layer, a second metal conductor, and a second capping layer overlaying the second metal conductor and a second liner layer encapsulating the second metal conductor, wherein the second capping layer has a different etch selectivity relative to the first capping layer;
a third interconnect level (Mx+2) on the second interconnect level comprising a third dielectric layer, and a third metal conductor; and
a skip via including a metal extending from the third interconnect level to the first interconnect level, wherein a portion of the second metal conductor including the second capping layer and a sidewall thereof in the second interconnect level is in a path of the skip via during formation thereof, wherein the sidewall comprises a self-formed barrier layer effective in combination with the capping layer to be electrically isolated from the skip via.

17. The semiconductor device of claim 16, wherein the skip via opening further comprise spacer material on sidewalls defining the skip via, and a liner layer on the spacer material.

18. The semiconductor device of claim 16, wherein the self-formed barrier layer comprises $MnSi_xO_y$, wherein x:y=1:3 to 3:5.

19. The semiconductor device of claim 16, wherein the first, second and third metal conductor and the metal filled via opening comprise Cu, Co, Al, AlCu, Ti, TiN, Ta, TaN, W, WN, MoN, Pt, Pd, Os, Ru, $IrO_2$, $ReO_2$, $ReO_3$, alloys thereof, or mixtures thereof.

20. The semiconductor device of claim 16, wherein the self-formed barrier layer comprises a reaction product between an alloying element in the second metal conductor and at least oxygen in the spacer insulator.

* * * * *